US011689210B2

(12) United States Patent
K et al.

(10) Patent No.: US 11,689,210 B2
(45) Date of Patent: Jun. 27, 2023

(54) METHODS AND APPARATUS TO CALIBRATE A DUAL-RESIDUE PIPELINE ANALOG TO DIGITAL CONVERTER

(71) Applicant: Texas Instruments Incorporated, Dallas, TX (US)

(72) Inventors: Prasanth K, Kerala (IN); Srinivas Kumar Reddy Naru, Bangalore (IN); Visvesvaraya Appala Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 46 days.

(21) Appl. No.: 17/515,041

(22) Filed: Oct. 29, 2021

(65) Prior Publication Data

US 2023/0138266 A1 May 4, 2023

(51) Int. Cl.
*H03M 1/10* (2006.01)
(52) U.S. Cl.
CPC ................. *H03M 1/1009* (2013.01)
(58) Field of Classification Search
CPC .......................................... H03M 1/1009
USPC ....................................................... 341/120
See application file for complete search history.

(56) References Cited

U.S. PATENT DOCUMENTS

| | | | | |
|---|---|---|---|---|
| 7,576,676 B2* | 8/2009 | Grace | ................. | H03M 1/1042 341/161 |
| 7,808,417 B2* | 10/2010 | Nazemi | ................... | H03M 1/44 341/161 |
| 8,018,370 B2* | 9/2011 | Thomas | ................... | H03F 3/211 341/161 |
| 8,970,460 B2* | 3/2015 | Yaguma | ............... | G09G 3/3696 345/87 |
| 10,476,455 B1* | 11/2019 | Astrachan | ............... | H03M 5/08 |
| 10,608,655 B1* | 3/2020 | Li | ........................ | H03M 1/1057 |
| 2009/0096647 A1* | 4/2009 | Nazemi | .................... | H03M 1/44 341/122 |
| 2011/0187573 A1* | 8/2011 | Thomas | .............. | H03M 1/0619 341/155 |

(Continued)

*Primary Examiner* — Jean B Jeanglaude
(74) *Attorney, Agent, or Firm* — Valerie M. Davis; Frank D. Cimino

(57) ABSTRACT

An example apparatus includes: an analog input; a resistor circuit including a first reference output and a second reference output; a first amplifier including a first analog input, a first reference input, and a first amplifier output, the first analog input coupled to the analog input, the first reference input coupled to the first reference output; a second amplifier including a second analog input, a second reference input, and a second amplifier output, the second analog input coupled to the analog input, the second reference input coupled to the second reference output; a first comparator including a first comparator input, the first comparator input coupled to the first amplifier output; and a second comparator including a second comparator input, the second comparator input coupled to the second amplifier output; a first multiplexer including a first multiplexer input and a first residue output, the first multiplexer input coupled to the first amplifier output; and a second multiplexer including a second multiplexer input and a second residue output, the second multiplexer input coupled to the second amplifier output.

24 Claims, 6 Drawing Sheets

(56) References Cited

U.S. PATENT DOCUMENTS

2013/0021229 A1* 1/2013 Ludden ............... G09G 3/3688
345/89
2014/0136876 A1* 5/2014 Steedman ............ H03K 5/1515
327/170

* cited by examiner

METHODS AND APPARATUS TO CALIBRATE A DUAL-RESIDUE PIPELINE ANALOG TO DIGITAL CONVERTER

TECHNICAL FIELD

This description relates generally to calibration, and more particularly to methods and apparatus to calibrate a dual-residue pipeline analog to digital converter.

BACKGROUND

Conventional mixed signal applications (e.g. personal electronic devices, automotive systems, industrial systems, systems that use analog sensors and digital processing, audio systems, and/or data reception/transmission systems) utilize an analog to digital converter (ADC) to convert an analog signal into a digital signal that may be processed by a digital signal processor. Mixed signal applications require the ADC to operate with good signal to noise ratio (SNR) and be capable of completing a conversion faster than the rate of the data transmission, such that the output may be sampled to construct an accurate digital representation of an analog input. To reduce the ADC power consumption and increase the conversion speed of the ADC, a pipeline ADC may be implemented. A pipeline ADC consists of a plurality of stages wherein each stage determines an analog value to subtract from the analog input in order to construct a digital output. A pipeline ADC stage preforms the analog value subtraction by converting an estimated digital value to an approximation of the analog value using a multiplying digital to analog converter (MDAC). The output of a pipeline ADC analog subtraction is amplified based on a threshold value, such that later stages may increase the resolution of the digital output. A pipeline ADC may determine an incorrect digital output based on deviations in the gain of each amplifier in each stage and the different stages continuously amplifying any noise on the analog signal. A pipeline ADC may accurately convert an analog input into a digital output if each stage of the pipeline ADC is calibrated to adjust for any deviations from the ideal gain and other deviations (e.g., noise).

SUMMARY

For methods and apparatus to calibrate a dual-residue pipeline ADC, an example apparatus includes an analog input; a resistor circuit including a first reference output and a second reference output; a first amplifier including a first analog input, a first reference input, and a first amplifier output, the first analog input coupled to the analog input, the first reference input coupled to the first reference output; a second amplifier including a second analog input, a second reference input, and a second amplifier output, the second analog input coupled to the analog input, the second reference input coupled to the second reference output; a first comparator including a first comparator input, the first comparator input coupled to the first amplifier output; and a second comparator including a second comparator input, the second comparator input coupled to the second amplifier output; a first multiplexer including a first multiplexer input and a first residue output, the first multiplexer input coupled to the first amplifier output; and a second multiplexer including a second multiplexer input and a second residue output, the second multiplexer input coupled to the second amplifier output.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
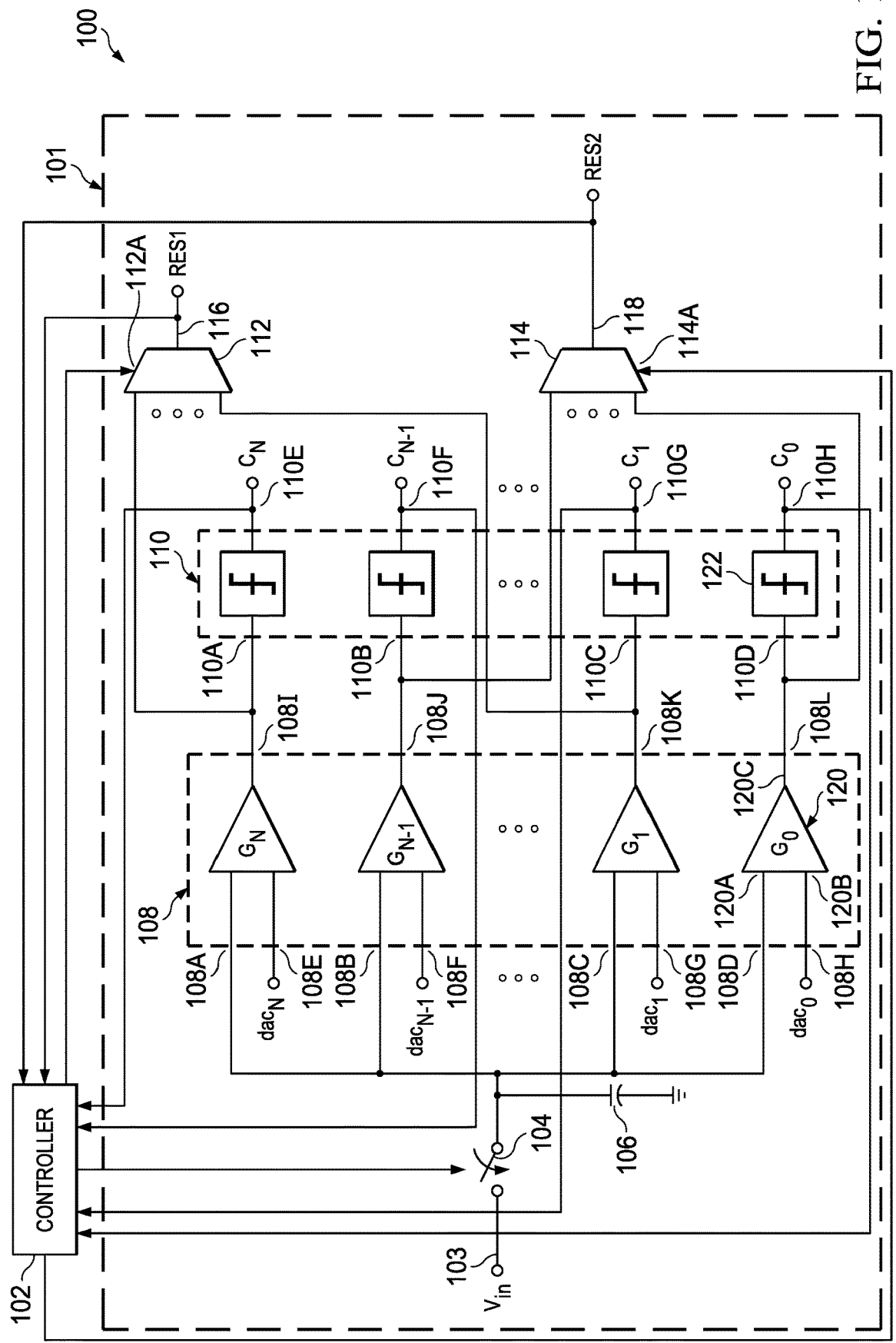
FIG. 1 is a schematic diagram of an example dual-residue pipeline ADC including a controller and dual-residue circuitry to determine two residue values from two different sets of amplifiers.

The drawings are not necessarily to scale.

Mixed signal applications may utilize an ADC capable of efficient and effective operation at various operating conditions. In some such applications, an ADC circuit may convert an external analog signal to a digital signal to be processed by a digital signal processor. The rate of the data transmission of the analog signal determines the rate at which the ADC may be configured to convert the analog input to a digital output, such that the digital output may be sampled to construct an accurate representation of the analog input. A pipeline ADC supports efficient operation over a wide range of transmission speeds using a plurality of stages.

A pipeline ADC includes a plurality of stages wherein a portion of an analog input is sampled (e.g. at each stage) to determine a portion of a digital output. A pipeline ADC stage may subtract an ideal analog representation of a digital value (which may be used as a portion of the digital representation for the analog input signal) from the analog input as a result of determining the digital value is represented by a portion of the analog input. The difference between the analog input and the portion of the analog input represented by the stage may be referred to as a residue. The residue from one stage is the input of the next stage. The pipeline ADC may require a digital to analog converter (DAC) to generate an analog value to be subtracted from the analog input, such that a digital signal processor may determine a DAC code to subtract from the analog input. A DAC code is a digital value representation of an analog value, such that the DAC code may be converted by the DAC to the analog value. The pipeline ADC may include as many stages as are needed to achieve the desired resolution of the digital output.

A pipeline ADC may determine an equivalent reconstructed signal ($Sig_{recon}$) based on the residue of each stage, such that the ideal values and residues may be combined to form an accurate reconstruction of the analog signal. At each stage of a pipeline ADC, the $Sig_{recon}$ is determined as the addition of the analog value of an ideal DAC value ($dac1_{ideal}$) and the division of the determined residue (res) by the ideal gain of the amplifier used to determine the residue ($A_{ideal}$). The determined residue may be determined based on the gain of the amplifier (A) used to determine the residue, the analog input (sig), and the analog value of the DAC value for the represented portion ($dac1_{out}$). The $Sig_{recon}$ may be determined based on sig and the difference between the gain and ideal gain of the amplifier ($\Delta A$), $A_{ideal}$, $dac1_{ideal}$, $dac1_{out}$, by A. The $Sig_{recon}$ may be determined using Equation (1), Equation (2), or Equation (3), below.

$$Sig_{recon} = dac1_{ideal} + \frac{res}{A_{ideal}}, \quad \text{Equation (1)}$$

$$Sig_{recon} = dac1_{ideal} + \frac{A*(sig - dac1_{out})}{A_{ideal}}, \quad \text{Equation (2)}$$

$$Sig_{recon} = \left(1 - \frac{\Delta A}{A_{ideal}}\right)*sig + \left(\frac{dac1_{ideal}*A_{ideal} - dac1_{out}*A}{A_{ideal}}\right). \quad \text{Equation (3)}$$

An example pipeline ADC includes a flash ADC and an MDAC. The flash ADC may be implemented by cascading a plurality of comparators coupled to a decoder to determine an ideal digital representation of an analog value. The MDAC includes a closed loop residue amplifier circuit and a capacitor array. The residue amplifier circuit has a large zero-frequency or low frequency gain (DC gain) and converges to an output value by the end of an amplification phase (the next time the capacitor array is coupled to a reference voltage). Any differences in the capacitance of the capacitors in the array of capacitors and the capacitance in the residue amplifier circuit results in gain errors. The settling time for the residue amplifier limits the maximum speed of the pipeline ADC. The settling time of the closed loop amplifiers depends on the bandwidth of the residue amplifier.

Another example pipeline ADC includes implementing the MDAC using an open-loop amplifier. The open-loop amplifier reduces power dissipation and de-couples reference settling from the open-loop amplifier. Reference settling is the duration of required for a feedback capacitor (coupled between an amplifier input and amplifier output) to converge to a reference voltage. The gain of the open-loop amplifier varies as a result of variations (e.g., supply voltage VDD variations, temperature variations, etc.) in the system. The gain of the open-loop amplifier may be estimated and corrected by the digital signal processor. The estimated gain often is corrupted as a result of mismatching components between the pipeline ADC stages and additive noise amplified by the open-loop amplifier.

Examples described herein include an example dual-residue pipeline ADC circuit that utilizes a process to calibrate the gain and MDAC. The dual-residue pipeline ADC circuitry includes an analog input, a digital output, a first residue output and a second residue output. An example residue output is comprised of a portion of the analog input as a result of an amplification. The first residue output and the second residue output may be averaged to get the effective ADC output. The process for gain and MDAC calibration includes a process to adjust a plurality of amplifier gains and adjust a plurality of reference inputs referred to as reference DAC values. A reference DAC value is a reference voltage supplied by an output of a resistor circuit (e.g., DAC ladder outputs, string DAC outputs, etc.). A zone is a voltage range between any two consecutive reference DAC values, such that a voltage range is constructed. The reference DAC values are configured to allow a plurality of open-loop reference amplifiers to construct a series of zones that determine a digital value, such that each zone corresponds to a bit of the digital output. The reference amplifier output may be combined with a plurality of other reference amplifier outputs to generate the first residue or the second residue. The process uses the dual residue outputs of the dual-residue pipeline ADC to minimize the variance of the difference between the residues as a result of incrementing the gain and reference DAC value of each open-loop amplifier. The process enables the dual-residue pipeline ADC to accurately convert an analog input to a digital output at high conversion rates.

FIG. 1 is a schematic diagram of an example dual-residue pipeline ADC 100 including dual-residue circuitry 101 and an example controller 102 to determine two residue values from two different sets of open-loop amplifiers. In the example of FIG. 1, the dual-residue circuitry 101 is coupled to a controller 102. The dual-residue circuitry 101 includes an analog input terminal 103, a switch 104, a capacitor 106, an array of open-loop amplifiers 108, an array of comparators 110, a first multiplexer (MUX) 112, a second MUX 114, a first residue output terminal 116, and a second residue output terminal 118.

In some examples, the dual-residue pipeline ADC 100 is a single integrated circuit (IC) (such as circuitry implemented on a single semiconductor die or on multiple die but within a single IC package). For example, the array of open-loop amplifiers 108 and the array of comparators 110 may be included on the same semiconductor die. In some examples, the dual-residue pipeline ADC 100 may be implemented by two or more ICs in a single IC package to implement a multi-chip module (MCM). In some examples, the dual residue pipeline ADC may be implemented by two or more ICs (such as two or more IC packages). For example, the array of open-loop amplifiers 108 (which may be implemented using comparators and/or operational amplifiers) and the array of comparators 110 (which may be implemented using any type of comparison circuitry and/or operational amplifiers) may be on a first die and the first MUX 112 may be on a second die. In some examples, the array of open-loop amplifiers 108 may be on a first die, the array of comparators 110 may be on a second die, and first MUX 112 may be on a third die. Alternatively, one or more hardware circuit components (such as the switch 104, the capacitor 106, etc.) of the dual-residue pipeline ADC 100 may be included in the array of open-loop amplifiers 108. Alternatively, one or more hardware circuit components (such as the first MUX 112, the second MUX 114, etc.) of the dual-residue pipeline ADC 100 may be included in the array of comparators 110.

In the example of FIG. 1, the switch 104 is coupled between the first analog input 103 and the capacitor 106. The switch 104 may be implemented as a transistor. The switch 104 may be configured to be enabled as a result of a completed analog to digital conversion. For example, the switch may be enabled as a result of determining the residue output terminals 116 and 118. Alternatively, the switch 104 may be configured to rapidly enable the dual-residue pipeline ADC 100, such that the dual-residue circuitry 101 may be coupled to the analog input terminal 103.

The capacitor 106 is coupled between the switch 104 and common potential (e.g., ground). The capacitor 106 is configured to hold the analog input terminal 103, such that the value of the analog input terminal 103 is stable for a duration long enough for the array of open-loop amplifiers 108 to settle. For example, the capacitor 106 may remain at the value of the analog input terminal 103 for a duration long enough to allow the array of open-loop amplifiers 108 to settle, such that the switch 104 may be disabled during a conversion.

A first plurality of inputs 108A-108D of the array of open-loop amplifiers 108 are coupled to the switch 104 and capacitor 106. The inputs 108A-108D of the array of open-loop amplifiers 108 individually correspond to a different amplifier comprising the array of open-loop amplifiers 108. Alternatively, the first plurality of inputs 108A-108D of the array of open-loop amplifiers 108 may be comprised of any number of inputs corresponding to any number of open-loop amplifiers. A second plurality of inputs 108E-108H of the array of open-loop amplifiers 108 may be individually referred to as an amplifier reference input. The inputs 108E-108H of the array of open-loop amplifiers 108 are individually coupled to a different reference DAC value and a different amplifier comprising the array of open-loop amplifiers 108. A portion of a plurality of outputs 108I-108L of the array of open-loop amplifiers 108 are coupled to the MUXs 112 and 114. For example, the outputs 108I and 108K may be coupled to the first MUX 112 whereas the outputs 108J and 108L are coupled to the second MUX 114. Alternatively, any plurality of outputs of the array of open-loop amplifiers 108 may be configured to be coupled to either of the MUXs 112 and/or 114.

The array of open-loop amplifiers 108 is configured to amplify the analog input by a gain. A magnitude of the analog input terminal 103 is amplified by the array of open-loop amplifiers 108 as a result of enabling the switch 104. The amplifiers comprising the array of open-loop amplifiers 108 are configured to individually amplify the magnitude of the analog input terminal 103 based on the difference between the inputs of the amplifiers comprising the array of open-loop amplifiers 108. For example, an amplifier 120 included in the array of open-loop amplifiers 108 includes a first input 120A coupled to the input 108D and a second input 120B coupled to the input 108H. A magnitude of an output 120C of the amplifier 120 is determined based on the difference between the inputs 120A and 120B. The magnitude of the output of 120C of the amplifier 120 may be divided by the difference between 120A and 120B to determine the gain of the amplifier 120.

A plurality of inputs 110A-110D of the array of comparators 110 are coupled to the outputs 108I-108L of the array of open-loop amplifiers 108. Each comparator in the array of comparators 110 may be zero-crossing comparators. Alternatively, the array of comparators 110 may be implemented with Schmitt triggers or any comparison circuit.

The array of comparators 110 is configured to determine if the outputs 108I-108L provided from the array of open-loop amplifiers 108 are positive or negative. For example, comparator 122 may determine that the output 120C of the amplifier 120 is negative as a result of a magnitude of the first input 120A of the amplifier 120 minus a magnitude of the second input 120B of the amplifier 120 being less than zero (e.g., the open-loop amplifier gain of the amplifier 120 is determined to be negative).

The first MUX 112 is coupled to the outputs 108I and 108K of the array of open-loop amplifiers 108. The first MUX 112 is configured to set the first residue output terminal 116. The second MUX 114 is coupled to the outputs 108J and 108L of the array of open-loop comparators 108. The second MUX 114 is configured to set the second residue output terminal 118.

The controller 102 (which may be implemented using logic circuitry, a processor, a state machine, software and/or analog circuitry) is coupled to the switch 104, the outputs 110E-110H of the array of comparators 110, a control terminal 112A of the first MUX 112, a control terminal 114A of the second MUX 114, the first residue output terminal 116, and the second residue output terminal 118.

The controller 102 is configured to enable the switch 104, such that the analog input terminal 103 is coupled to the inputs 108A-108D of the array of open-loop amplifiers 108. The controller 102 may be configured to enable the switch 104 based on the completion of an analog to digital conversion, such that another conversion is initialized.

The controller 102 is configured to configure the MUXs 112 and 114 based on a portion of the outputs 110E-110H of the array of open-loop comparators 110. For example, the controller 102 may be configured to control the first MUX 112 based on every other comparator output (such as 110E and 110G, or 110F and 110H) from the array of comparators 110. The controller 102 is configured to set the control terminal 112A of the first MUX 112 based on the outputs 110E and 110G of the array of comparators 110. The first MUX 112 is configured to couple the outputs 108I or 108K of the array of open-loop amplifiers 108 to the first residue output terminal 116 based on the value of the control terminal 112A. The controller 102 is configured to set the control terminal 114A of the second MUX 114 based on the outputs 110F and 110H of the array of comparators 110. The second MUX 114 is configured to couple the outputs 108J or 108L of the array of open-loop amplifiers 108 to the first residue output terminal 116 based on the value of the control terminal 114A. The controller 102 is configured to determine the zone of the analog input terminal 103 based on the outputs 110E-110H. For example, the controller 102 may configure the control terminal 114A of the second MUX 114 to couple the output 108J of the array of open-loop amplifiers 108 as a result of the outputs 110F-110H corresponding to positive outputs and 110E corresponding to a negative output.

The controller 102 receives the residue values at output terminals 116 and 118, such that the residues determined by the dual-residue circuitry 101 may be used in later stages of the analog to digital conversion.

In the example of FIG. 1, the analog input terminal 103 is coupled by switch 104 to the first plurality of inputs 108A-108D of the array of open-loop amplifiers 108. The amplifiers comprising the array of open-loop amplifiers 108 compare the magnitude of the analog input terminal 103 to the inputs 108E-108H of the array of open-loop amplifiers 108. The outputs 108I-108L of the array of open-loop amplifiers 108 are amplified by a gain ($G_i$—where the value of "i" is shown in FIG. 1 to range from 0 to N such that there are N+1 open-loop amplifiers) by the array of open-loop amplifiers 108. The outputs 110E-110H of the array of comparators 110 ($C_i$—where the value of "i" is shown in FIG. 1 to range from 0 to N such that there are N+1 comparators) are determined by the sign of the outputs 108I-108L of the array of open-loop amplifiers 108. For example, if the voltage of the analog input terminal 103 is greater than $dac_0$ an output 122A of the comparator 122 corresponds to a positive sign. The outputs 110E-110H of the array of comparators 110 determine an approximation of the zone that represents the analog input terminal 103. For example, the controller 102 may determine to set the control terminals 112A and 114A to couple the inputs of two consecutive comparators (e.g., $C_0$ and $C_1$, or $C_{N-1}$ and $C_N$) as the result of the analog input terminal 103 being between the reference DAC values associated with the corresponding consecutive comparators. Advantageously, the array of comparators 110 determines the sign of the outputs 108I-108L of the array of open-loop amplifiers 108, reducing metastability issues in flash memory (e.g., a comparator is unable to make the sign decision in a given time), offset constraints, and noise constraints compared to conventional pipeline ADCs.

In the example of FIG. 1, the output of the amplifier 120 is coupled to the second MUX 114 by the controller 102 as a result of the magnitude of the analog input terminal 103 being greater than $dac_0$ and less than any other reference DAC value implemented on the inputs 108E-108H of the array of open-loop amplifiers 108. The second MUX 114 generates the second residue on the second residue output terminal 118 based on the output 120C of the amplifier 120 of the array of open-loop amplifiers 108. Advantageously, the outputs 108I-108L of the array of open-loop amplifiers 108 are divided such that half of the amplifiers contribute to each of the two residues. Advantageously, the use of open-loop amplifiers in the dual-residue pipeline ADC 100 reduces the time it takes for the residue amplifier to settle. Advantageously, the noise and offset constraint produced by the comparison of the analog input terminal 103 is reduced as the result of the array of comparators 110 configured to be zero-crossing comparators.

Figure 2A:
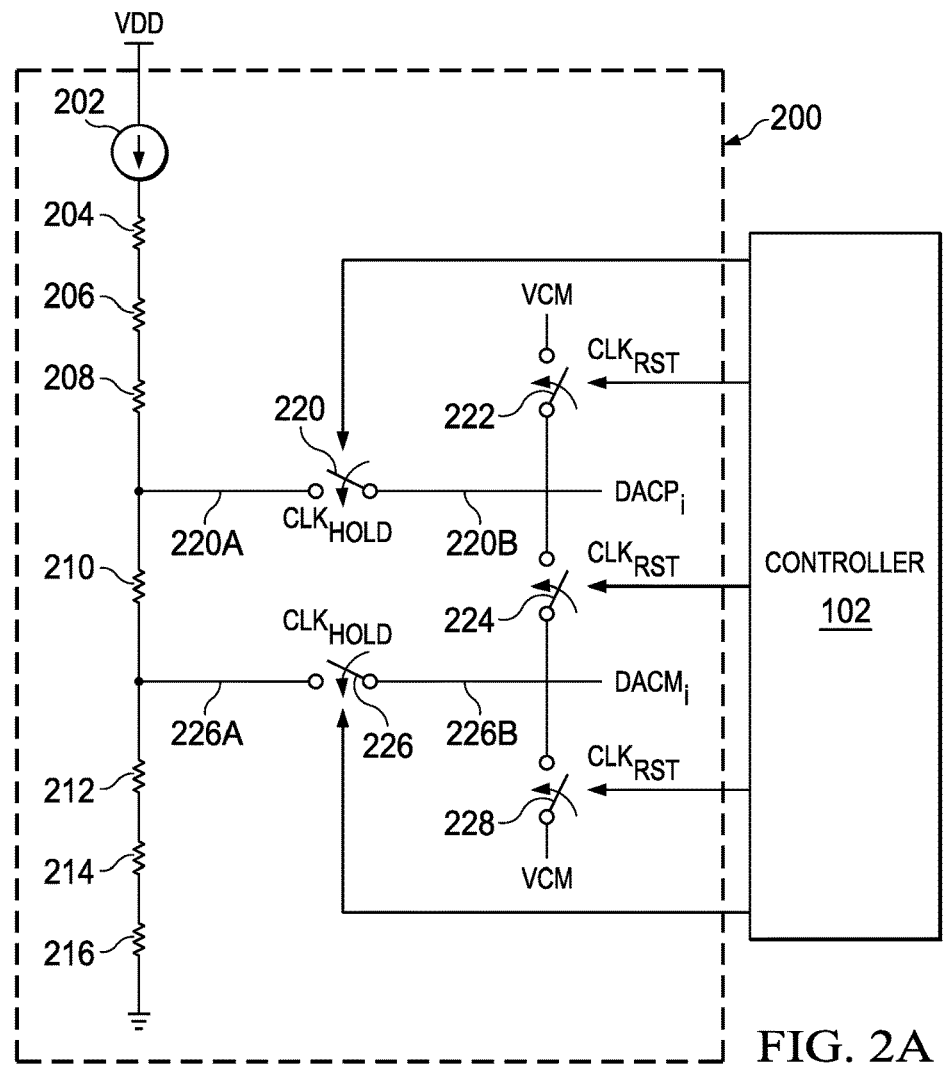
FIG. 2A is a schematic diagram of an example digital to analog converter (DAC) that may be implemented by the dual residue pipeline ADC of FIG. 1.

FIG. 2A is a schematic diagram of an example DAC level generation circuit 200 which may be implemented by the dual residue pipeline ADC of FIG. 1 to determine reference DAC values of the inputs 108E-108H of the array of open-loop amplifiers 108. The DAC level generation circuit 200 is coupled to the controller 102 of FIG. 1, such that the controller 102 may enable portions of the DAC level generation circuit 200. In the example of FIG. 2A, the DAC level generation circuit 200 includes a current source 202, a first resistor 204, a second resistor 206, a third resistor 208, a fourth resistor 210, a fifth resistor 212, a sixth resistor 214, a seventh resistor 216, a first switch 220, a second switch 222, a third switch 224, a fourth switch 226, and a fifth switch 228. In the example of FIG. 2A, the switches 220-228 may alternatively be transistors in a switch configuration.

In the example of FIG. 2A, the current source 202 is coupled between supply voltage VDD and the first resistor 204. The first resistor 204 is configured to generate a voltage level corresponding to the supply voltage VDD minus a magnitude of the first resistor 204 times a magnitude of the current source 202. The second resistor 206 is coupled between the first resistor 204 and the third resistor 208. Alternatively, the second resistor 206 may be separated from the third resistor 208 by a plurality of resistors configured to support additional DAC levels by the DAC level generation circuit 200. The second resistor 206 is configured to generate a voltage level corresponding to the supply voltage VDD minus a magnitude of the first resistor 204 plus the second resistor 206 times the magnitude of the current source 202. The third resistor 208 is configured to generate a voltage level corresponding to the supply voltage VDD minus, a magnitude of the first resistor 204 plus the second resistor 206 plus the third resistor 208, times the magnitude of the current source 202. The fourth resistor 210 is coupled between the resistors 208 and 212. The fourth resistor 210 is configured to generate a voltage level corresponding to the supply voltage VDD minus, a combined magnitude of the resistors 204-210, times the magnitude of the current source 202. The fifth resistor 212 is coupled between the resistors 210 and 214. The fifth resistor 212 is configured to generate a voltage level corresponding to the supply voltage VDD minus, a combined magnitude of the resistors 204-212, times the magnitude of the current source 202. The sixth resistor 214 is coupled between the resistors 212 and 216. The sixth resistor 214 is configured to generate a voltage level corresponding to the supply voltage VDD minus, a combined magnitude of the resistors 204-214, times the magnitude of the current source 202. The seventh resistor 216 is coupled between the resistors 214 and common potential (e.g., ground).

A first terminal 220A of the first switch 220 is coupled between the third resistor 208 and the fourth resistor 210. The first switch 220 is configured to be coupled to the voltage level generated between the resistors 208 and 210 to a second terminal ($DACP_i$) 220B of the first switch 220. The second terminal 220B of the first switch 220 may be coupled to one of the inputs 108E-108H of the array of open-loop amplifiers 108 of FIG. 1. The second switch 222 is coupled between common mode voltage (VCM) and the second terminal 220B of the first switch 220. The second switch 222 is configured to reset the reference DAC value $DACP_i$ as a result of being enabled. The fourth resistor 210 is coupled between the first terminal 220A of the first switch 220 and a first terminal 226A of the fourth switch 226. The third switch 224 is coupled between the second terminal 220B and the first switch 220 and a second terminal ($DACM_i$) 226B of the fourth switch 226. The third switch 224 is configured to reset the reference DAC value $DACM_i$ as a result of enabling the switches 222 or 228. The fourth switch 226 is configured to couple the voltage level generated between the resistors 210 and 212 to the second terminal 226B of the fourth switch 226. The second terminal 226B of the fourth switch 226 may be coupled to one of the inputs 108E-108H (e.g. the configuration of switches, 220-228, and supplies, VCM, as shown for resistor 210 may be used for each of the resistor 204-216, and each of the different terminals corresponding to 220B and 226B may be connected to a different input of 108E-108H) of the array of open-loop amplifiers 108. The fifth switch 228 is coupled between the second terminal 226B of the fourth switch 226 and VCM. The fifth switch 228 is configured to reset the reference DAC value $DACM_i$ as a result of being enabled.

In the example of FIG. 2A, the current source 202 supplies a current through resistors 202-216, such that the voltage difference between the first terminal 220A of the first switch 220 and the first terminal 226A of the fourth switch 226 represents a DAC level. A DAC level is a change in voltage that may represent a digital bit of the position corresponding to that DAC level, configured to increase the resolution of the output. A DAC level may be referred to as a zone, such as the DAC level between resistors 208 and 212. For example, if the DAC level generation circuit 200 was determined to have eight DAC levels (by replicating the configuration of switches 220-228 between different resistors), the potential resolution of the output of the ADC may be up to three bits ($2^3=8$). Advantageously, the DAC level generation circuit 200 enables resetting the reference DAC values and the array of open-loop amplifiers 108 (to the level decided by the ADC accuracy) during the sampling of the ADC, reducing the settling time of the ADC resulting in faster ADC operation. Advantageously, resetting the reference DAC values and the array of open-loop amplifiers 108 (to the level decided by the ADC accuracy) during the sampling of the ADC enables the process of FIG. 4 to be implemented to increase the ADC accuracy.

Figure 2B:
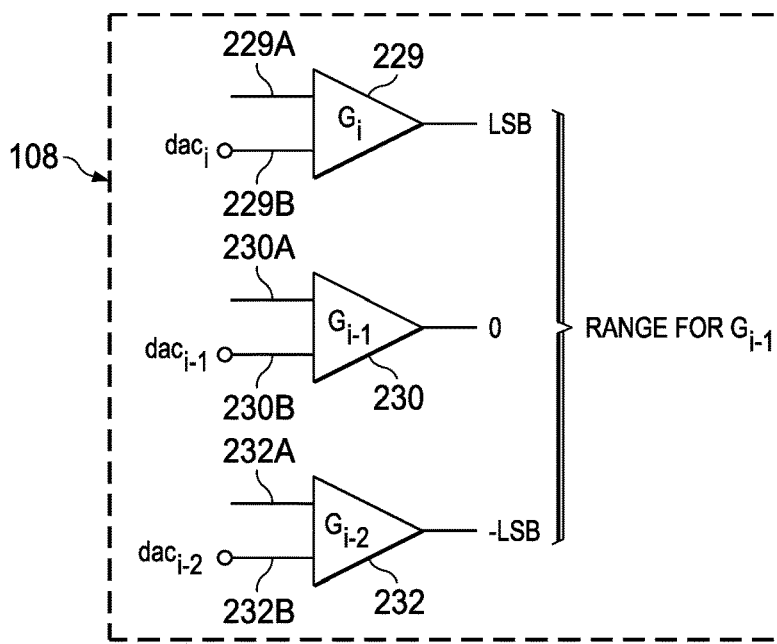
FIG. 2B is a schematic diagram of an example amplifier array that may be implemented by the dual residue pipeline ADC of FIG. 1.

FIG. 2B is a schematic diagram of an example array of open-loop amplifiers 108 that may be implemented by the dual residue pipeline ADC of FIG. 1. In the example of FIG. 2B, the array of open-loop amplifiers 108 includes a first amplifier 229, a second amplifier 230, and a third amplifier 232. The amplifiers 229-232 include a first input 229A, 230A, and 232A coupled to the first analog input 103 of FIG. 1 and a second input 229B, 230B, and 232B of the amplifiers 229-232 represent different reference DAC values. In the example of FIG. 2B, the second input of the amplifiers 229-232 are different voltage levels generated by the DAC level generation circuit 200 of FIG. 2B (e.g., $DACP_1$ and $DACM_1$).

In example operation, a first input of the second amplifier 230 is coupled to the first analog input 103 of FIG. 1. The second terminal 220B of the first switch 220 of FIG. 2A may be coupled to a second input ($dac_{i-1}$) of the second amplifier 230. A first input of the third amplifier 232 is coupled to the first analog input 103 of FIG. 1. The second terminal 226B of the fourth switch 226 of FIG. 2A may be coupled to a second input ($dac_{i-2}$) of the third amplifier 232. Alternatively, the $dac_{i-1}$ of the second amplifier 230 may be configured to be the difference in voltage between the first terminal 220A of the first switch 220 of FIG. 2A and the first terminal 226A of the fourth switch 226 of FIG. 2.

The output of the second amplifier 230 is negative if the voltage of $dac_{i-1}$ is greater than the voltage of the first analog input 103 of FIG. 1. The output of the third amplifier 232 is positive if the voltage of $dac_{i-2}$ is less than the voltage of the first analog input 103 of FIG. 1. As such, the outputs of amplifiers 230 and 232 suggest that the voltage of the first analog input 103 of FIG. 1 is between $dac_{i-1}$ and $dac_{i-2}$. The sign of the output of the second amplifier 230 is determined by a comparator in the array of comparators 122 of FIG. 1. In the example of FIG. 1, the first residue output terminal 116 may represent the output of the second amplifier 230 and the second residue output terminal 118 may represent the output of the third amplifier 232. The amplifiers 228-232 enable an accuracy of plus or minus the least significant bit (LSB) divided by two times the threshold value (e.g., the analog value of $dac_{i-1}$). Advantageously, the configuration of the array of open-loop amplifiers 108 of FIG. 1 updates both residues as a result of the sign comparison by the array of comparators 122 of FIG. 1. Advantageously, the sign comparison, to determine at least one residue from an amplifier output, is not impacted by the magnitude of the amplifier input (e.g., $dac_{i-1}$, $dac_{i-2}$, etc.), thereby allowing the offset and noise requirements for the array of comparators 122 of FIG. 1 to be less stringent.

Figure 3:
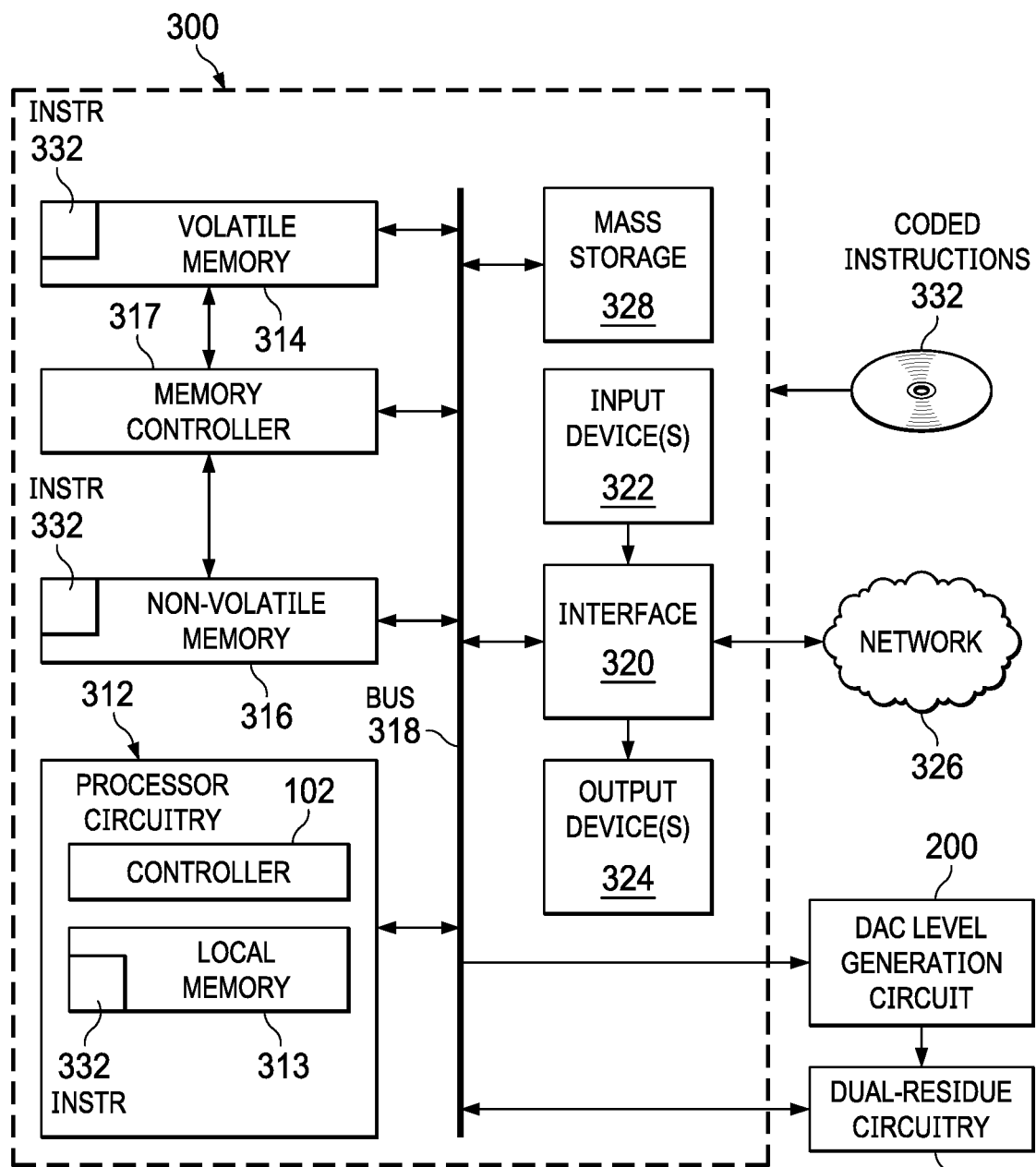
FIG. 3 is a block diagram of an example processing platform including processor circuitry structured to execute the example machine readable instructions and/or the example operations of FIG. 4 to calibrate the dual-residue pipeline ADC of FIG. 1.
Figure 4:
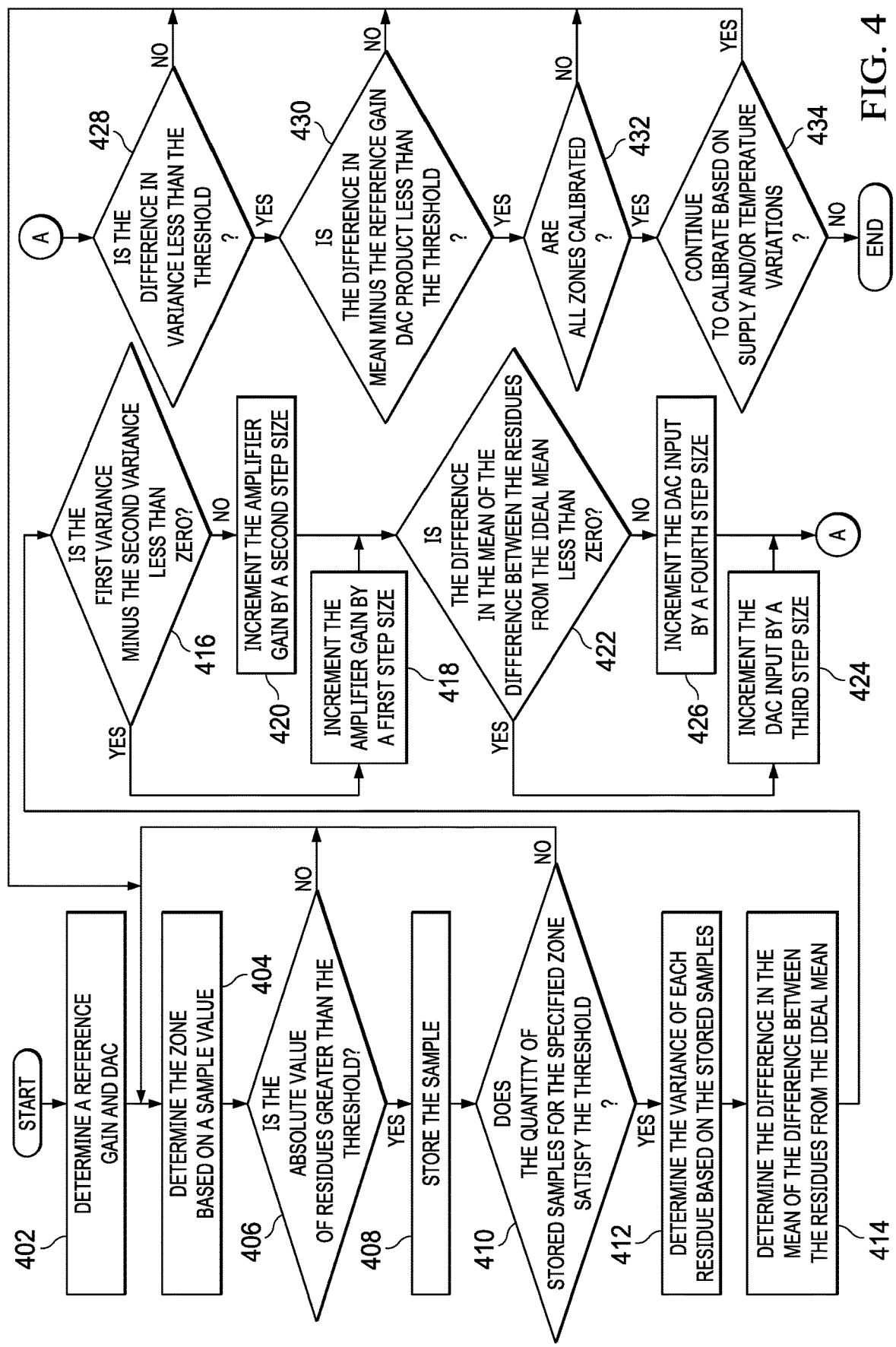
FIG. 4 is a flowchart representative of example machine readable instructions and/or example operations that may be executed by example processor circuitry to calibrate the dual-residue pipeline ADC of FIG. 1.

FIG. 3 is a block diagram of an example processor platform 300 structured to execute and/or instantiate the machine-readable instructions and/or the operations of FIGS. 1, 2A, and 4, to calibrate the apparatus of FIGS. 1 and 2A. The processor platform 300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 300 of the illustrated example includes processor circuitry 312. The processor circuitry 312 can be implemented by one or more integrated circuits, logic circuits, FPGAs microprocessors, CPUs, GPUs, DSPs, and/or microcontrollers from any desired family or manufacturer. The processor circuitry 312 may be implemented by one or more semiconductor based (e.g., silicon based) devices. In this example, the processor circuitry 312 implements the controller 102. Processor circuitry 312 may utilize firmware and/or software.

The processor circuitry 312 of the illustrated example includes a local memory 313 (e.g., a cache, registers, etc.). The processor circuitry 312 of the illustrated example is in communication with a main memory including a volatile memory 314 and a non-volatile memory 316 by a bus 318. The volatile memory 314 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 316 may be implemented by flash memory and/or any other desired type of memory device. Access to the main memory 314, 316 of the illustrated example is controlled by a memory controller 317.

The processor platform 300 of the illustrated example also includes interface circuitry 320. The interface circuitry 320 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 322 are connected to the interface circuitry 320. The input device(s) 322 permit(s) a user to enter data and/or commands into the processor circuitry 312. The input device(s) 322 can be implemented by, for example, an audio sensor, a microphone, a camera (still or video), a keyboard, a button, a mouse, a touchscreen, a track-pad, a trackball, an isopoint device, and/or a voice recognition system.

One or more output devices 324 are also connected to the interface circuitry 320 of the illustrated example. The output device(s) 324 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 320 of the illustrated example, thus, typically includes a graphics driver card, a graphics driver chip, and/or graphics processor circuitry such as a GPU.

The interface circuitry 320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 326. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 300 of the illustrated example also includes one or more mass storage devices 328 to store software and/or data. Examples of such mass storage devices 328 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine executable instructions 332, which may be implemented by the machine-readable instructions of FIG. 4, may be stored in the mass storage device 328, in the volatile memory 314, in the non-volatile memory 316, and/or on a removable non-transitory computer readable storage medium such as a CD or DVD.

FIG. 4 is a flowchart representative of example machine readable instructions and/or example operations that may be executed by example processor circuitry (such as processor circuitry 312) operable to calibrate the dual-residue pipeline ADC of FIG. 1. The machine-readable instructions 400 begin at block 402, where a reference gain ($G_0$) and a reference DAC value ($dac_0$) are selected, by the processor circuitry 312 of FIG. 3, by selecting an open-loop amplifier from the array of open-loop amplifiers 108 of FIG. 1. The selected open-loop amplifier includes a reference gain ($G_0$) and a reference DAC value ($dac_0$). $G_0$ is referenced as the gain of the amplifiers in the array of open-loop amplifiers 108 of FIG. 1, such that the gain of each open-loop amplifier does not need to be estimated.

At block 404, the processor circuitry 312 determines a zone based on a sample value of the analog input. A zone corresponds to a voltage range between any two consecutive DAC values (e.g., the reference DAC value of the first input 120B of the amplifier 120 of FIG. 1) that may be approximated to determine a bit of the digital output. For example, the ADC may have an output resolution of eight bits corresponding to eight different zones. A zone consists of a first open-loop amplifier of gain ($G_i$), a first threshold reference DAC value ($dac_i$), a first comparator output ($C_i$), a second open-loop amplifier gain ($G_{i-1}$), a second threshold reference DAC value ($dac_{i-1}$), and a second comparator output ($C_{i-1}$). The more zones that the ADC is divided into, the higher the resolution of the ADC output. The zone chosen consists of variables $G_i$, $dac_i$, and $C_i$ corresponding to the first residue output (RES1) 116 of FIG. 1 and the variables $G_{i-1}$, $dac_{i-1}$, and $C_{i-1}$ corresponding to the second residue output (RES2) 118 of FIG. 1. The control then proceeds to block 406.

At block 406, the processing circuitry 312 determines if the absolute value of the residues is greater than the threshold. The sample of the analog input used in block 404 to determine the zone may be used by block 406 to determine the absolute value of the residues. The threshold that the absolute value of the residues is compared to is determined based on the accuracy required by the application and noise requirements. If the processing circuitry 312 determines the absolute value of the residues is not greater than the threshold, then the control proceeds to block 404.

If at block 406, the processing circuitry 312 determines the absolute value of the residues are greater than the threshold, then the control proceeds to block 408 to store the sample value. The control proceeds to block 410.

At block 410, the processing circuitry 312 determines if enough samples of the two residue outputs (RES1 and RES2) are sampled and/or stored including contributions from the zone selected in block 404 that satisfy a threshold. The zone contributes to the residue value based on whether the external analog signal includes a voltage contribution in the zone determined in block 404. For example, if the zone determined in block 404 represents the MSB, then the sample of the residue values may contribute to the samples stored if the MSB of the first digital output holds a logic value of '1' (and ideally the other digital outputs hold a logic value of '0'). The sample of RES1 and RES2 is considered to satisfy the threshold if the absolute value of the difference between the sampled value of the first analog input 103 (X) and $dac_i$ is greater than a noise threshold ($x_{th}$) as represented by Equation (4), below.

$$|X - dac_i| > x_{th}, \qquad \text{Equation (4)}.$$

If at block 410, the processor circuitry 312 determines there is enough samples that satisfy the threshold for the zone chosen in block 404, then the control proceeds to block 412 to determine the variance of each residue ($S_1$ for RES1 and $S_2$ for RES2). Alternatively, if at block 410, there is not enough samples that satisfy the threshold for the zone chosen in block 404, then the control proceeds to block 404. To determine the variance using reduced circuitry, $L_1$ norm ($L_{1norm}$) may be used. $L_{1norm}$ may be determined by Equation (5), below, for a plurality of samples that Equation (4), above, is true. Some applications of the machine-readable instructions 400 may only use $L_{1norm}$ to calculate variance $S_1$ and $S_2$. Advantageously, the use of $L_{1\ norm}$ to replace finding the variance reduces the hardware used to run the machine-readable instructions 400 compared to determining the variance across a plurality of samples.

$$L_{1norm} = \Sigma |G_i^*(X - dac_i)|, \qquad \text{Equation (5)}.$$

At block 414, the processing circuitry 312 determines the difference between the mean of the difference between the residues and an ideal mean of the difference between the residues. The ideal mean difference between residues (which may be referred to as a reference mean difference or a reference gain DAC product) is determined based on the $dac_0$ and $G_0$ values from block 402, such that the reference mean difference is the same for all open-loop amplifiers in the array of open-loop amplifiers 108 of FIG. 1. The mean (p) of the difference between the two residues (RES2-RES1) may be determined by adding the difference between the residues for the samples used to determine the variance (or approximate the variance). The mean of the difference between the residues, as represented by Equation (6), below, may be compared to the ideal mean of the difference between the residues determined by the ideal gain reference ($G_{ideal}$) times a first step size (6) times the ideal reference DAC value ($dac_{ideal}$), as represented by Equation (7), below. At block 416, the processing circuitry 312 determines if the first variance ($S_1$) minus the second variance ($S_2$) is less than zero.

$$M_1 = \mu(RES2 - RES1), \qquad \text{Equation (6)}.$$

$$M_1 = G_{ideal}^*(\gamma dac_{ideal}), \qquad \text{Equation (7)}.$$

If at block 416, the processor circuitry 312 determines the first variance ($S_1$) minus the second variance ($S_2$) is less than zero, then the control proceeds to block 418 where $G_i$ is incremented by ($\delta$), as represented by Equation (8), below. The control then proceeds to block 422.

$$G_i = G_i + \delta, \qquad \text{Equation (8)}.$$

If at block 416, the processing circuitry 312 determines the first variance ($S_1$) minus the second variance ($S_2$) is not less than zero, then the control proceeds to block 420 where $G_i$ is incremented by a second step size ($-\delta$), as represented by Equation (9), below. The control then proceeds to block 422.

$$G_i = G_i + (-\gamma), \qquad \text{Equation (9)}.$$

At block 422, the processor circuitry 312 determines if the difference between the mean of the difference between the residues and the ideal mean of the difference between the residues ($M_1$) is less than zero.

If at block 422, the processing circuitry 312 determines the difference between the mean of the difference between the residues and the ideal mean of the difference between the residues ($M_1$) is less than zero, then the control proceeds to block 424 where $dac_i$ is incremented by a third step size ($\epsilon$), as represented by Equation (10), below. The control then proceeds to block 428.

$$dac_i = dac_i + \epsilon, \quad \text{Equation (10).}$$

If at block 422, the processor circuitry 312 determines the difference between the mean of the difference between the residues and the ideal mean of the difference between the residues ($M_1$) is not less than zero, then the control proceeds to block 426 where $dac_i$ is incremented by a fourth step size ($-\epsilon$), as represented by Equation (11), below. The control then proceeds to block 428.

$$dac_i = dac_i + (-\epsilon), \quad \text{Equation (11).}$$

At block 428, the processor circuitry 312 determines whether the difference in variance ($S_1-S_2$) is less than a noise threshold. If at block 428, the processing circuit 312 determines that the difference in variance ($S_1-S_2$) is not less than the noise threshold, then the control proceeds to block 404.

If at block 428, the processor circuitry 312 determines the difference in variance ($S_1-S_2$) is less than the noise threshold, then the control proceeds to block 430. At block 430, the processor circuit 312 determines if the difference in mean minus the reference gain DAC product is less than the threshold. If at block 430, the processor circuitry 312 determines that the difference in mean minus the reference gain DAC product is not less than the threshold, then the control will proceed to block 404. If at block 430, the processor circuitry 312 determines that the difference in mean minus the reference gain DAC product is less than the threshold, then the control will proceed to block 432. A value representing that the selected amplifier is calibrated may be stored, including calibrated values for $G_i$ and $dac_i$.

At block 432, the processor circuitry 312 determines if all zones are calibrated. If at block 432, the processor circuitry 312 determines all zones are not calibrated, then the control proceeds to block 404 (for a different zone, for example). If at block 432, the processor circuitry 312 determines all zones are calibrated, then the control proceeds to block 434.

At block 434, the processor circuitry 312 determines if the processor circuitry 312 should continue to calibrate based on supply and/or temperature variations. If at block 434, the processing circuitry 312 determines to continue to calibrate, then the control proceeds to block 404. If at block 434, the processing circuitry determines not to continue to calibrate, then the control ends. Alternatively, the control may continue to proceed as the ADC is converting analog values to digital values.

In the example of FIG. 4, the processor circuitry 312 described is configured to calibrate the dual-residue pipeline ADC 100 of FIG. 1. Alternatively, the machine-readable instructions 400 in FIG. 4 may be separated into a plurality of separate machine-readable instruction sets. For example, a first example instruction set determines if $G_i$ should be incremented by the first or second step size until the difference in variance of the residue is less than a threshold. A second example instruction set determines if $dac_i$ should be incremented by the third or fourth step size until the difference in mean of residue minus reference mean difference is less than a threshold.

Advantageously, the use of a reference gain (e.g., $G_0$) and reference DAC value (e.g., $dac_0$) to determine the reference mean difference enables the machine-readable instructions 400 of FIG. 4 to calibrate the open-loop gain and reference DAC values of the amplifiers in the array of open-loop amplifiers 108 of FIG. 1 to be equal to the reference gain and reference DAC value in order to reduce the possibility of non-linearities in ADC operation. Advantageously, the number of samples collected in block 410 (e.g., $\delta$ (e.g., from blocks 418 and 420), $\epsilon$ (from blocks 424 and 426), and $x_{th}$) may be selected to reduce the error of the ADC, such that the error is less than the resolution of the ADC. Advantageously, the machine-readable instructions 400 described in FIG. 4 reduces non-linearity noise degradation caused by incomplete settling, mismatched reference DAC values, and gain errors. Advantageously, the machine-readable instructions 400 described in FIG. 4 enable the use of the array of open-loop amplifiers 108 of FIG. 1 and the simple DAC 2A of FIG. 2.

Figure 5:
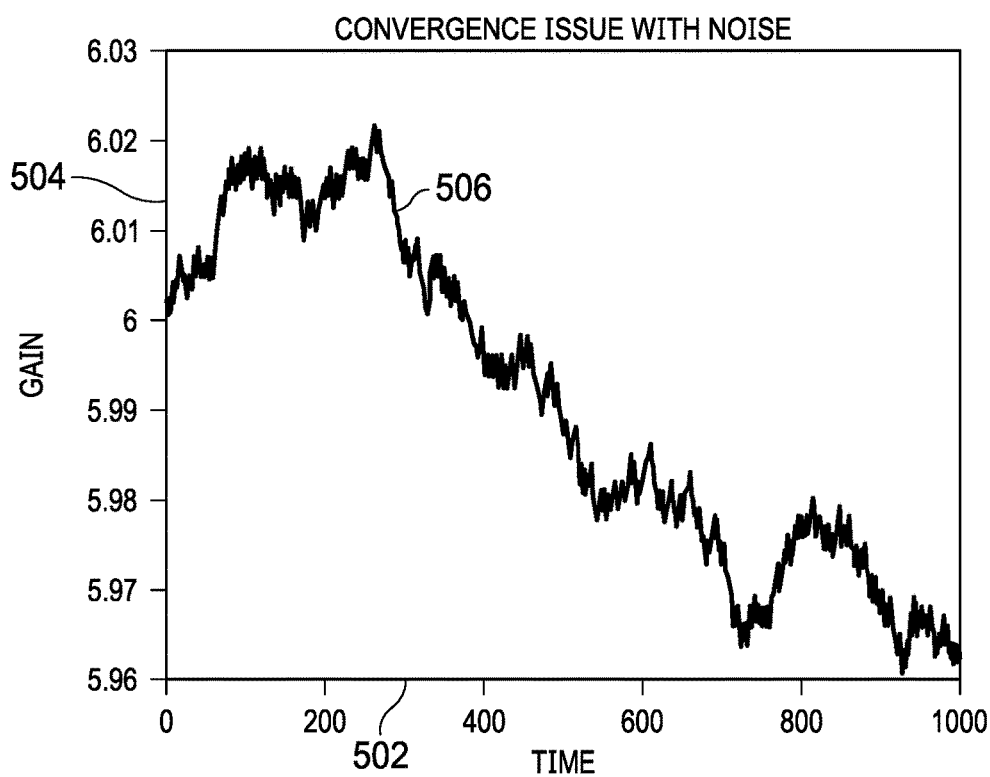
FIG. 5 is a graph of gain versus time of the noisy estimated gain of an amplifier included in the dual residue pipeline ADC circuit of FIG. 1 versus time.

FIG. 5 is an example diagram of gain versus time for a noisy amplifier included in the dual residue pipeline ADC circuit of FIG. 1. In the example of FIG. 5 the diagram includes a horizontal time axis 502, a vertical axis 504 representing estimated gain found by the process of FIG. 4, and a line 506.

In the example of FIG. 5, the line 506 represents the gain estimated by the process of FIG. 4 if the determined variance is the variance of the differences in the two residues (e.g., block 412 of FIG. 4). The line 506 represents the process of FIG. 4 attempting to estimate the gain by reducing the variance of the difference between the first residue output terminal 116 of FIG. 1 and the second residue output terminal 118 of FIG. 1. The process of FIG. 4 successfully reduces the variance of the difference in residues too near zero (distance from zero depends on the step sizes chosen in block 418, 420, 424, and 426 of FIG. 4).

In the example of FIG. 5, the gain estimated by the process of FIG. 4 continues to change over time despite reducing the variance of the residues to near zero. The estimated gain determined by the process of FIG. 4 continues to change as a result of additive noise (e.g., the combination of white noise, amplifier noise, backend stage noise, etc.) that is added onto the determined variance. The additive noise contribution to the variance is substantially greater than the variance that is near zero as found by the process of FIG. 4. The additive noise prevents the process of FIG. 4 from converging on an estimated gain.

In the example of FIG. 5, the line 506 represents the effect of noise added into the variance calculations. As a result of the problem of convergence, the process of FIG. 4 includes the determination such that the process of FIG. 4 may only be updated if the determined variance, including additive noise contributions, is greater than a threshold value. The process of FIG. 4 to estimate a gain is based on reducing the difference in variance of residues including additive noise. Advantageously, the inclusion of the threshold value to determine if the process of FIG. 4 may update reduces the time that the process of FIG. 4 takes to estimate a gain and reduces the noise in estimation of gain.

Figure 6A:
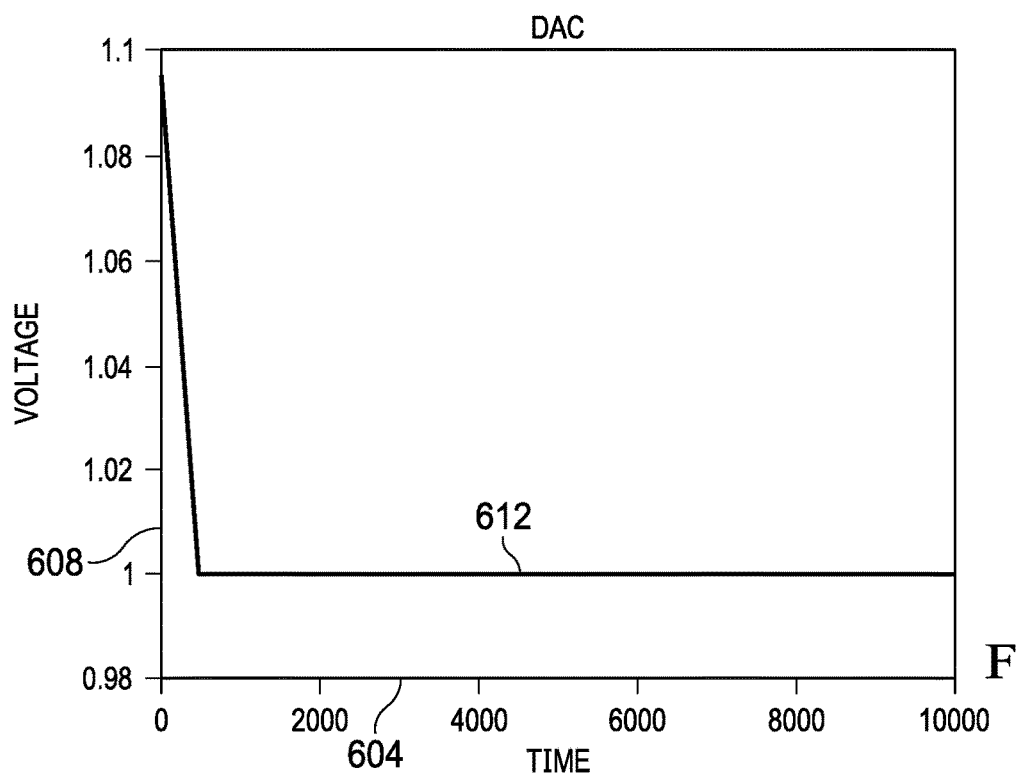
FIG. 6A-6C are example graphs of the convergence of the gain and DAC value using the dual residue pipeline ADC of FIG. 1 implementing the process of FIG. 4.
Figure 6B:
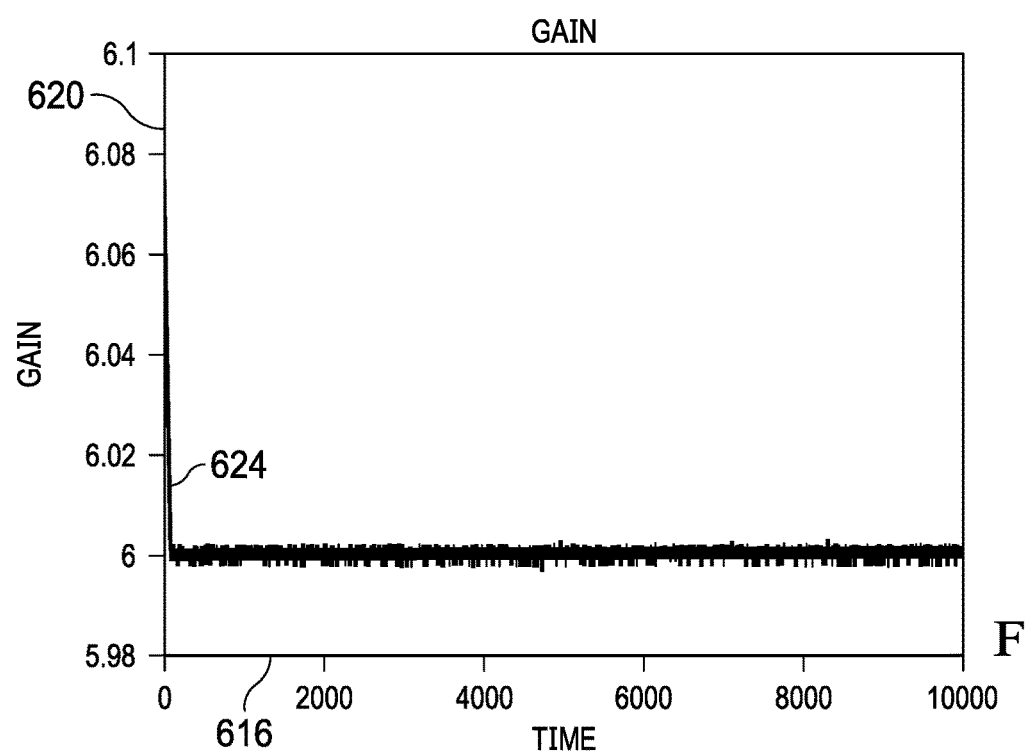
Figure 6C:
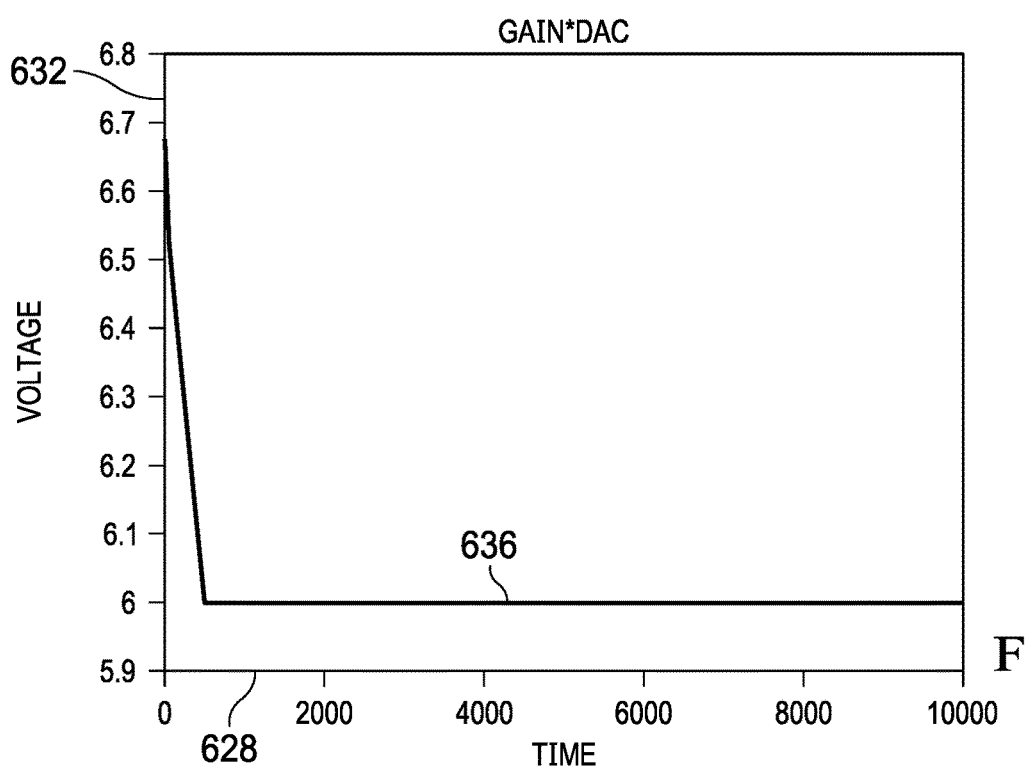

FIG. 6A-6C are example diagrams of the convergence of the gain and DAC value using the dual residue pipeline ADC of FIG. 1 implementing the process of FIG. 4. In the example of FIG. 6, there are three example plots demonstrating example operation of the process of FIG. 4. A first example plot 6A demonstrates an example of the process of FIG. 4 to determine an estimated reference DAC value. A second example plot 6B demonstrates an example of the process of FIG. 4 to determine an estimated gain. A third example plot 6C demonstrates an example of the process of FIG. 4 to determine an estimated gain times reference DAC value.

In the example FIG. 6A, the first plot 6A includes a horizontal axis 604, a vertical axis 608, and a line 612. The horizontal axis 604 is a time axis. The vertical axis 608 is a voltage axis. The line 612 represents the estimated reference DAC value determined by the process of FIG. 4 versus time.

In the example of FIG. 6A, the line 612 demonstrates the process of FIG. 4 adjusting the reference DAC value in response to the mean of difference in residue minus reference mean difference. The line 612 converges towards approximately 1 volt in increments of the third or fourth step size of blocks 424 and 426 of FIG. 4.

In the example FIG. 6B, the horizontal axis 616 represents time, and the vertical axis 620 represents gain. The line 624 represents the estimated gain determined by the process of FIG. 4 versus time.

In the example of FIG. 6B, the line 624 demonstrates the process of FIG. 4 adjusting the gain in response to the reducing variance of the difference between the residues. The line 624 converges towards approximately 6 in increments of the first or second step size of blocks 418 and 420 of FIG. 4. Advantageously, the process of FIG. 4 reduces the gain to a point of convergence faster and with better accuracy than the line 506 of FIG. 5 as the result of using the difference in variance of residues (demonstrated by block 416 of FIG. 4) and comparing the determined variance to the threshold value (demonstrated by block 406 of FIG. 4) to determine if the process should update.

In the example FIG. 6C, the horizontal axis 628 represents time, the vertical axis 632 represents voltage, and line 636 represents the estimated reference DAC value multiplied by the gain determined by the process of FIG. 4 versus time.

In the example of FIG. 6C, the line 636 demonstrates the process of FIG. 4 adjusting the reference DAC value and the gain in response to the reducing variance of the difference between the residues and mean of the residues minus the reference mean difference. The line 636 converges towards approximately 6 volts in increments varying from the first to fourth step sizes of blocks 418, 420, 424, and 426 of FIG. 4. Advantageously, the process of FIG. 4 reduces the reference DAC value and gain to a point of convergence faster and with better accuracy than the line 506 of FIG. 5 as the result of using difference in variance of residues (demonstrated by block 416 of FIG. 4) and comparing the determined variance to the threshold value (demonstrated by block 406 of FIG. 4) to determine if the process of FIG. 4 should update.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" describes the structural and functional characteristics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above-described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

The following claims are hereby incorporated into this Detailed Description by this reference, with each claim standing on its own as a separate embodiment of the present disclosure.

What is claimed is:

1. An apparatus comprising:
   an analog input;
   a resistor circuit including a first reference output and a second reference output;
   a first amplifier including a first analog input, a first reference input, and a first amplifier output, the first analog input coupled to the analog input, the first reference input coupled to the first reference output;
   a second amplifier including a second analog input, a second reference input, and a second amplifier output, the second analog input coupled to the analog input, the second reference input coupled to the second reference output;
   a first comparator including a first comparator input, the first comparator input coupled to the first amplifier output; and
   a second comparator including a second comparator input, the second comparator input coupled to the second amplifier output;
   a first multiplexer including a first multiplexer input and a first residue output, the first multiplexer input coupled to the first amplifier output; and
   a second multiplexer including a second multiplexer input and a second residue output, the second multiplexer input coupled to the second amplifier output.

2. The apparatus of claim 1, where in the analog input is coupled to a plurality of inputs of a plurality of amplifiers.

3. The apparatus of claim 1, where in the resistor circuit includes a plurality of reference DAC values coupled to a plurality of inputs of inputs of a plurality of amplifiers.

4. The apparatus of claim 1, wherein the resistor circuit includes a plurality of switches to adjust the first reference output.

5. The apparatus of claim 1, wherein the first comparator is a zero-crossing comparator configured to determine a sign of the first amplifier output.

6. The apparatus of claim 1, wherein the second comparator is a zero-crossing comparator configured to determine a sign of the second amplifier output.

7. The apparatus of claim 1, wherein the first multiplexer includes a plurality of inputs coupled to a plurality of amplifier outputs.

8. The apparatus of claim 1, wherein the second multiplexer includes a plurality of inputs coupled to a plurality of amplifier outputs.

9. An analog to digital converter (ADC) comprising:
   a plurality of open-loop amplifiers, each of the plurality of open-loop amplifiers configured to amplify one of a plurality of reference inputs by an amplifier gain and provide such amplified reference input at an output of each of such open-loop amplifiers;
   a plurality of comparators, each coupled to the output of one of the plurality of the open-loop amplifiers, the plurality of comparators configured to determine a sign of the outputs of the plurality of open-loop amplifiers;
   a first residue output coupled to a first portion of the outputs of the plurality of the open-loop amplifiers;
   a second residue output coupled to a second portion of the outputs of the plurality of open-loop amplifiers, the second portion is different than the first portion; and
   a controller coupled to each of the plurality of comparators and operable to:
     determine approximately a mean of a difference between the first residue output and the second residue output;
     increment the reference inputs; and
     increment the amplifier gain of the open-loop amplifiers.

10. The ADC of claim 9, wherein the open-loop amplifiers may be configured to generate an estimate a digital value representing an analog input based on comparing the reference inputs to different reference DAC values.

11. The ADC of claim 9, wherein the comparators may be configured as an ADC with a resolution of plus or minus a least significant bit (LSB) divided by two times of a reference input.

12. The ADC of claim 9, wherein the controller is to minimize the difference between the mean of the difference between the first residue output and the second residue output and a reference mean difference.

13. The ADC of claim 9, wherein the controller is to calibrate the reference inputs of the amplifiers of the array of open-loop amplifiers to a reference input and amplifier.

14. The ADC of claim 9, wherein the open-loop amplifiers include a plurality of amplifier gains which are incremented towards a reference gain.

15. The ADC of claim 9, wherein the reference inputs and the plurality of outputs of the array of open-loop amplifiers may be reset.

16. The ADC of claim 9, wherein the controller is to calibrate the amplifier gain of each of the open-loop amplifiers.

17. A method comprising:
configuring an amplifier gain to be a gain reference;
configuring a plurality of DAC ladder outputs to be reference DAC values;
determining a zone between a plurality of reference DAC values in response to an analog input;
determining a plurality of residues in response to determining the zone;
determining a mean of a difference between the plurality of residues in response to determining the plurality of residues;
determining a difference between the mean of the difference between the plurality of residues and a reference mean difference in response to determining the mean of the difference between the plurality of residues;
incrementing the reference DAC values in response to determining the difference between the mean of the difference between the plurality of residues and the reference mean difference; and
incrementing the amplifier gains in response to:
determining the plurality of residues; and
determining a variance of each residue.

18. The method of claim 17, further comprising determining a variance of only the residues if the absolute value of each residue is greater than a threshold.

19. The method of claim 17, further comprising determining a difference in variance between the plurality of residues.

20. The method of claim 17, wherein the reference mean difference may be determined by an ideal gain reference multiplied by an ideal reference DAC value.

21. The method of claim 17, wherein the DAC ladder outputs are determined by a DAC ladder including a resistor circuit and plurality of switches to adjust the reference DAC values.

22. The method of claim 17, further comprising a plurality of amplifier gains corresponding to a plurality of zones represented by a plurality of reference DAC values.

23. The method of claim 17, further comprising a plurality of increments of the same reference DAC values as a result of the difference between the mean of the difference between the residues and a reference mean difference being greater than or equal to a threshold.

24. The method of claim 17, wherein the amplifier gains are incremented based on the difference in the variance of each residue for a zone of each residue.

* * * * *